United States Patent
Chen

(10) Patent No.: US 6,222,227 B1
(45) Date of Patent: Apr. 24, 2001

(54) MEMORY CELL WITH SELF-ALIGNED FLOATING GATE AND SEPARATE SELECT GATE, AND FABRICATION PROCESS

(75) Inventor: Chiou-Feng Chen, Cupertino, CA (US)

(73) Assignee: Actrans System Inc., Santa Clara, CA (US)

( * ) Notice: Subject to any disclaimer, the term of this patent is extended or adjusted under 35 U.S.C. 154(b) by 0 days.

(21) Appl. No.: 09/370,557

(22) Filed: Aug. 9, 1999

(51) Int. Cl.$^7$ .................................................. H01L 29/788
(52) U.S. Cl. ................................................................ 257/316
(58) Field of Search ........................... 365/185.01, 185.05, 365/185.17, 185.18, 185.26, 185.28, 185.29, 185.33; 257/316

(56) References Cited

U.S. PATENT DOCUMENTS

| | | | |
|---|---|---|---|
| 4,698,787 | 10/1987 | Mukherjee et al. | 365/185.29 |
| 4,794,565 | 12/1988 | Wu et al. | 365/185.15 |
| 5,029,130 | 7/1991 | Yeh | 365/185.31 |
| 5,047,814 | 9/1991 | Hanzani | 365/185.29 |
| 5,280,446 * | 1/1994 | Ma et al. | 365/185.28 |
| 5,284,784 | 2/1994 | Manley | 437/43 |
| 5,402,371 | 3/1995 | Ono | 365/185.07 |
| 5,404,037 | 4/1995 | Manley | 257/318 |
| 5,455,792 | 10/1995 | Yi | 365/185.12 |
| 5,495,441 * | 2/1996 | Hong | 365/185.01 |
| 5,500,384 | 3/1996 | Melzner | 438/631 |
| 5,504,706 | 4/1996 | D'Arrigo et al. | 365/185.18 |
| 5,643,812 | 7/1997 | Park | 257/320 |
| 5,767,005 | 6/1998 | Doan et al. | 438/593 |
| 5,770,501 | 6/1998 | Hong | 438/264 |
| 5,792,670 | 8/1998 | Pio et al. | 437/43 |
| 5,841,165 | 11/1998 | Chang et al. | 257/318 |
| 5,844,271 | 12/1998 | Sethi et al. | 257/318 |
| 5,847,996 | 12/1998 | Guterman et al. | 365/185.28 |
| 5,883,409 * | 3/1999 | Guterman et al. | 257/316 |
| 6,011,288 * | 1/2000 | Lin et al. | 257/316 |
| 6,034,894 * | 3/2000 | Maruyama et al. | 365/185.17 |

* cited by examiner

Primary Examiner—Trong Phan
(74) Attorney, Agent, or Firm—Flehr Hohbach Test Albritton & Herbert LLP

(57) ABSTRACT

Memory cell having a floating gate with lateral edges which are aligned directly above edges of the active area in the substrate, a control gate positioned directly above the floating gate, and a select gate spaced laterally from the control gate. The floating gate has a bottom wall and side walls which face corresponding walls of the control gate in capacitive coupling relationship, with the height of the side walls being on the order of 80 to 160 percent of the width of the bottom wall. In some embodiments, the floating gate is wider than the overlying control gate and has projecting portions which overlie the source and drain regions of the stack transistor. The memory cell is fabricated by forming a poly-1 layer and an overlying dielectric film on a substrate in areas in which the stack transistors are to be formed, forming a poly-2 layer over the dielectric film and over areas of the substrate in which the select transistors are to be formed, patterning the poly-2 layer to form control gates for the stack transistors and select gates for the select transistors, removing the poly-1 layer and the dielectric film to form floating gates in areas which are not covered by the control gates, and forming source and drain regions in the substrate. The floating gates are aligned with active areas in the substrate by forming isolation oxide regions which extend above the substrate at the edges of the active areas, and forming the floating gates on the sides of the isolation oxide regions in alignment with the edges of the active areas.

28 Claims, 12 Drawing Sheets

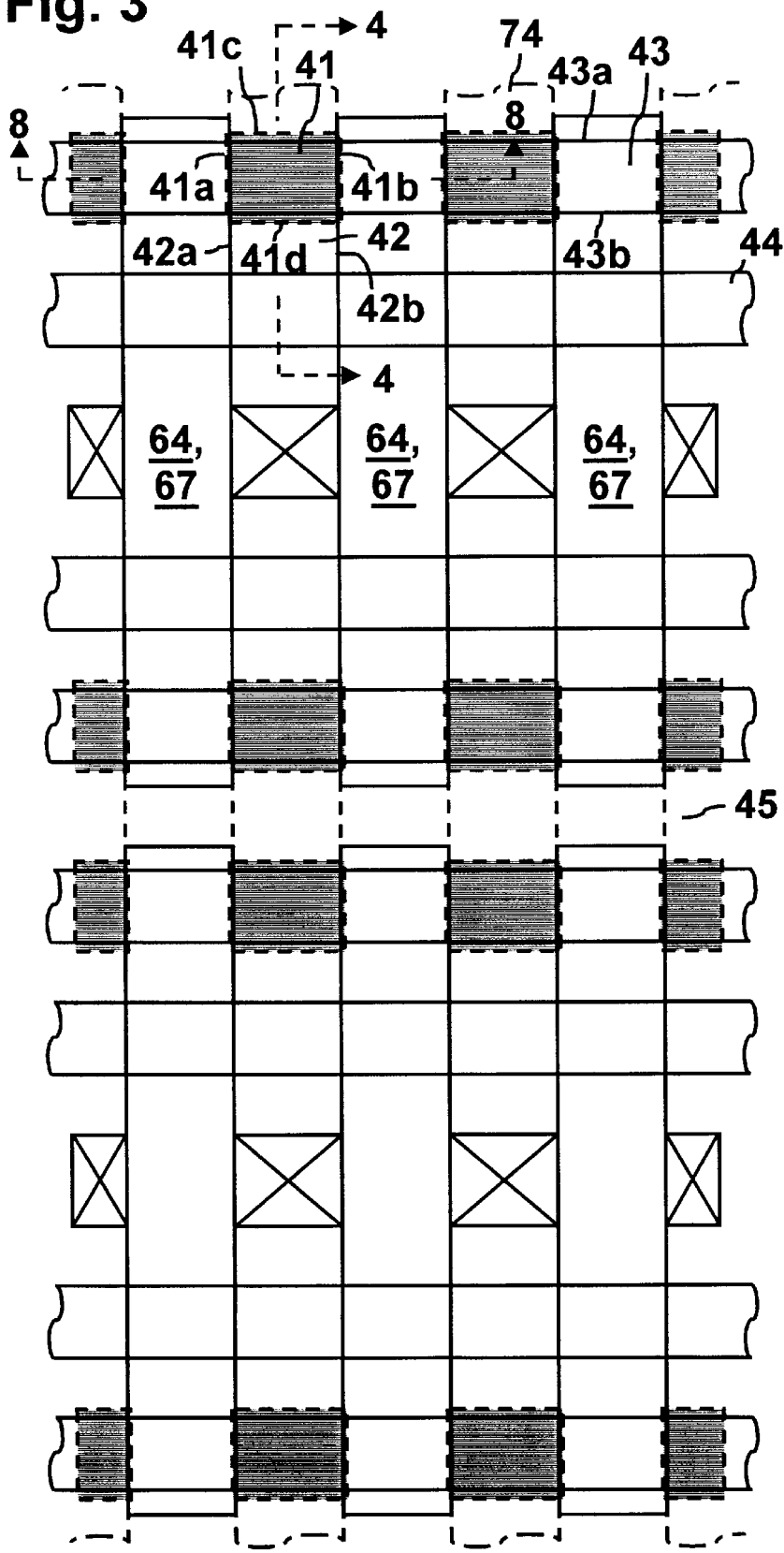

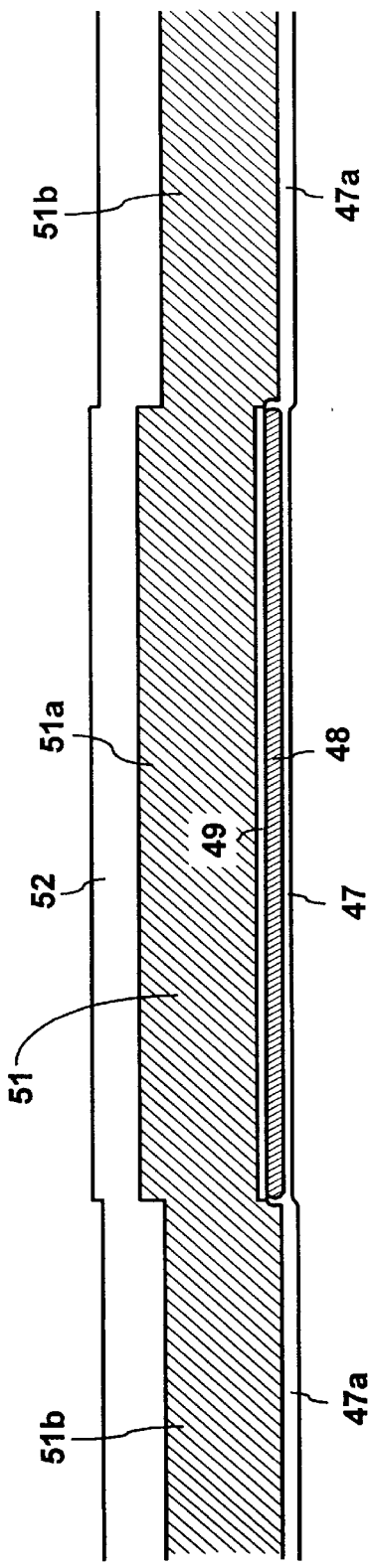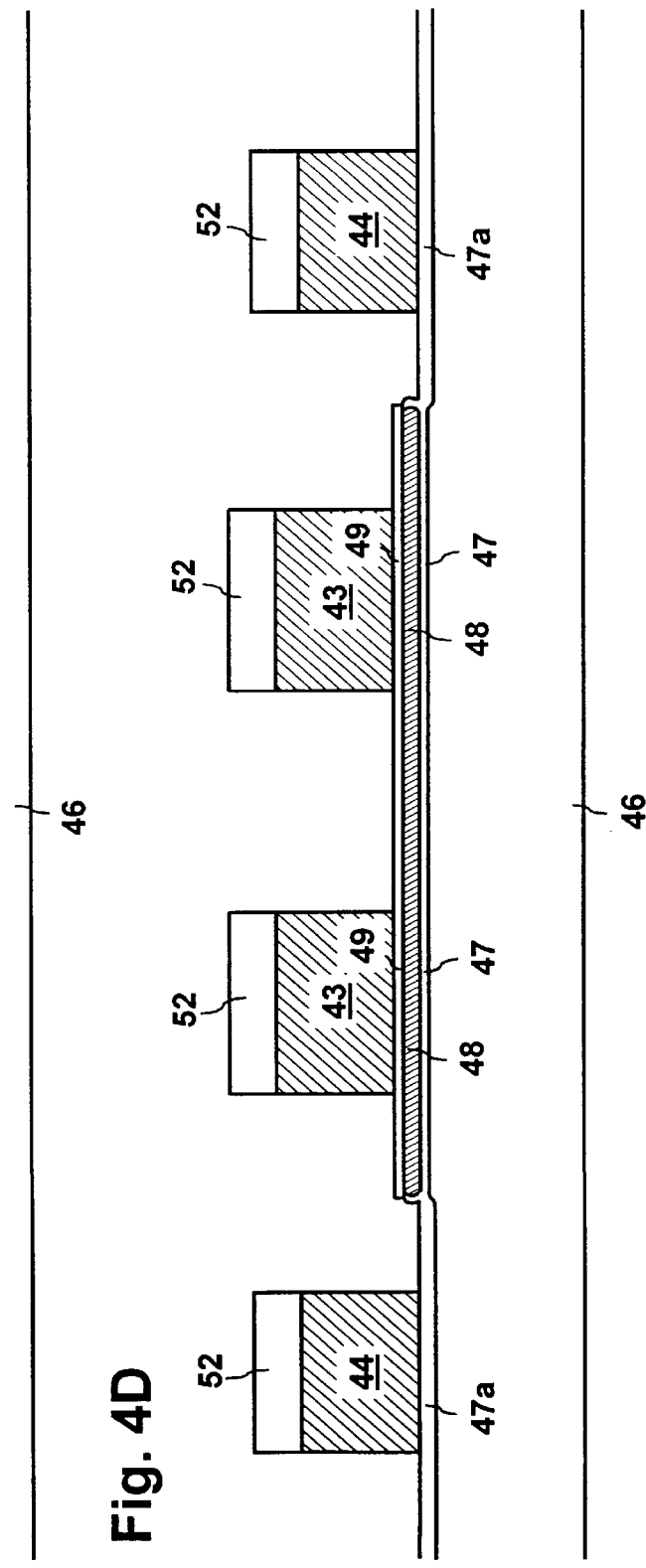

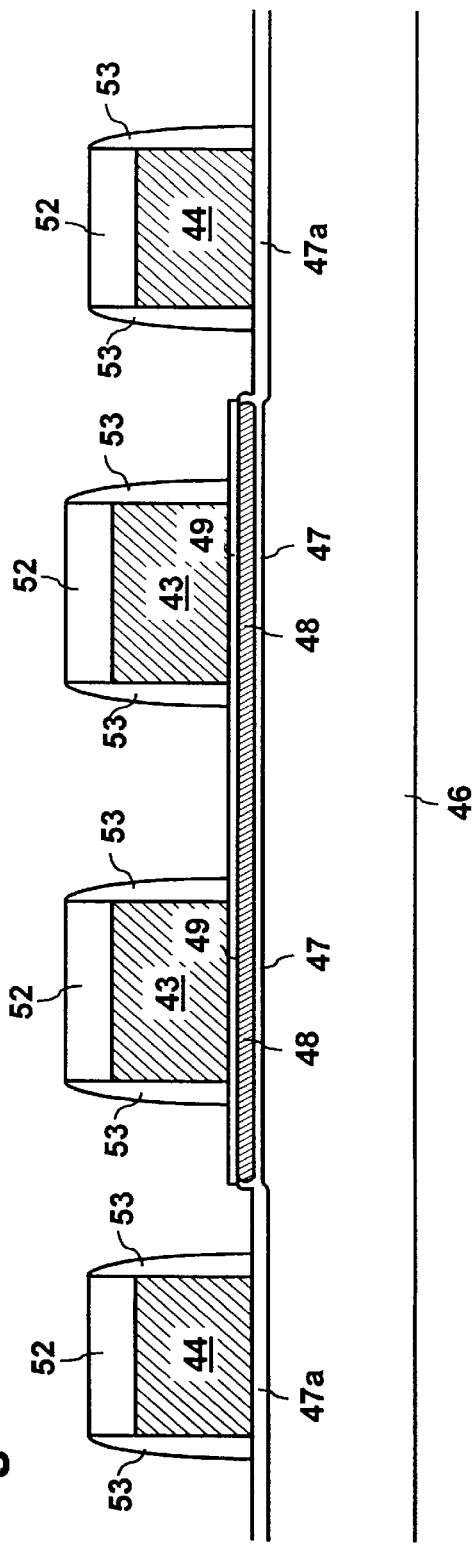

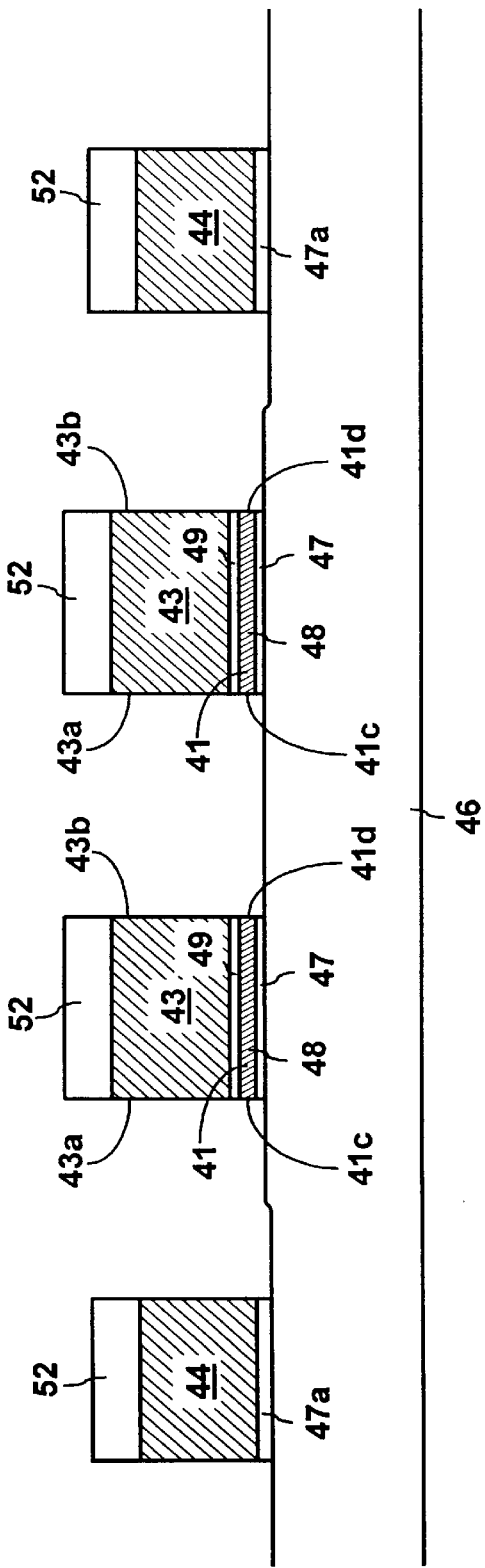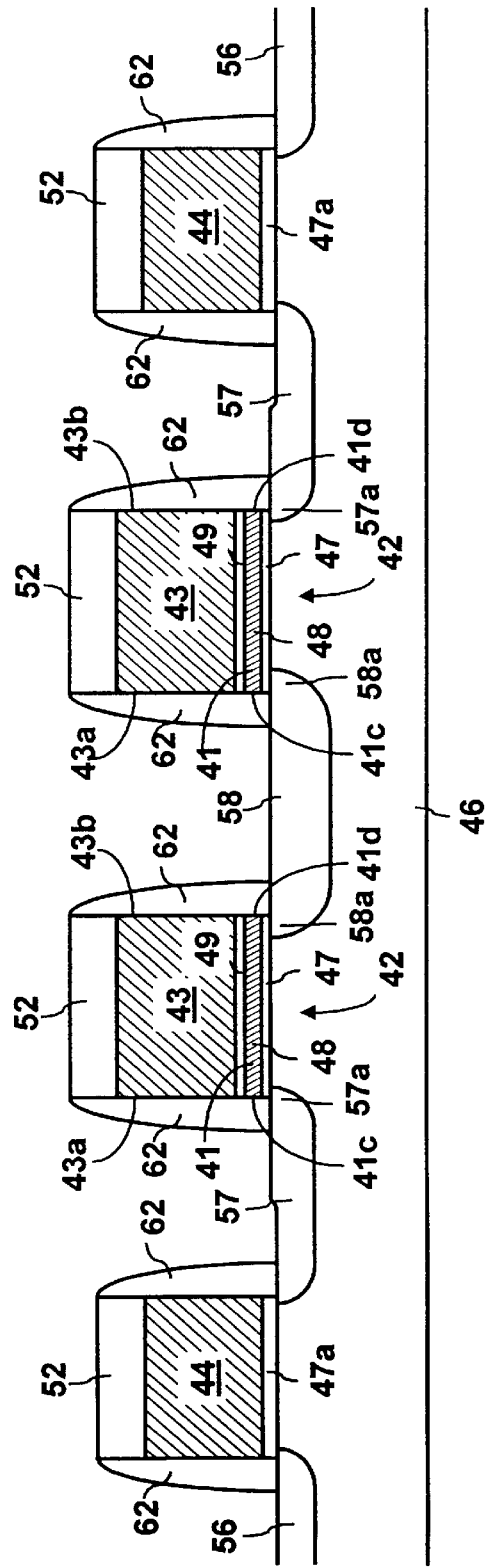

MEMORY CELL WITH SELF-ALIGNED FLOATING GATE AND SEPARATE SELECT GATE, AND FABRICATION PROCESS

BACKGROUND FIELD OF INVENTION

This invention pertains generally to semiconductor devices and, more particularly, to a nonvolatile memory device and fabrication process.

RELATED ART

Electrically programmable read only memory (EPROM) has been widely used as nonvolatile memory which can keep data unchanged even though the power is turned off. However, EPROM devices have a major disadvantage in that they have to be exposed to Ultra-Violet (UV) light for about 20 minutes for data erasure. This is very inconvenient because an EPROM device has to be unplugged from its socket and moved to the UV light source when the data needs to be changed.

Electrically erasable programmable read only memory (EEPROM) overcomes this problem and permits data to be erased electrically in a much shorter period of time, typically less than 2 seconds. However, it still has a disadvantage in that the data must be erased on a byte-by-byte basis.

Flash EEPROM is similar to EEPROM in that data is erased electrically and relatively quickly. However, with flash EEPROM, the data is erased in blocks which typically range in size from 128 to 64K bytes per block, rather than on a byte-by-byte basis.

In general, there are two basic types of nonvolatile memory cell structures: stack-gate and split-gate. The stack-gate memory cell usually has a floating gate and a control gate, with the control gate being positioned directly above the floating gate. In a split-gate cell the control gate is still positioned above the floating gate, but it is offset laterally from it. The fabrication process for a stack-gate cell is generally simpler than that for a split-gate cell. However, a stack-gate cell has an over-erase problem which a split-gate cell does not have. This problem is commonly addressed by maintaining the threshold voltage of the cell in a range of about 0.5–2.0 volts after an erase cycle, which adds complexity to the circuit design.

A split-gate memory cell has an additional gate known as a select gate which avoids the over-erase problem and makes circuit design relatively simple. Such cells are typically fabricated in double-poly or triple-poly processes which are relatively complex, and they are more susceptible to various disturbances during programming and read operations.

EEPROM devices have typically included a stack-gate transistor and a separate select gate transistor. With no over-erase problem, circuit design has been relatively simple, but these devices have a relatively high die cost due to larger cell size as compared to split-gate and stack-gate memory cells.

A memory cell is erased by forcing electrons to migrate away from the floating gate so that it becomes charged with positive ions. This is commonly accomplished by Fowler-Nordheim tunneling in which a tunnel oxide having a thickness on the order of 70–120 Å is formed between the monocrystalline silicon substrate and the floating gate. A relative strong electric field (greater than 10 mV/cm) is then applied to the tunnel oxide, and the electrons tunnel from the floating gate toward the underlying source, drain or channel region. This technique is widely used both in stack-gate cells and in split-gate cells, and is described in greater detail in U.S. Pat. Nos. 5,792,670, 5,402,371, 5,284,784 and 5,445,792.

Another way of forming an erase path is to grow a dielectric film between two polysilicon (poly-Si) layers as a tunneling dielectric. U.S. Pat. No. 5,029,130 discloses the formation of a sharp edge on the floating gate to enhance the local electric field around it, with the erase path being formed between the sharp edge and the control gate. By adding a third polycrystalline silicon layer as an erase layer which crosses over, or overlies, the floating gate and the control gate, an erase path can be formed between the side wall of floating gate and the erase layer. This technique is disclosed in U.S. Pat. Nos. 5,847,996 and 5,643,812.

Fowler-Nordheim tunneling can also be used to program a memory cell by forcing electrons to tunnel into the floating gate so that it becomes charged negatively. U.S. Pat. Nos. 5,792,670 and 5,402,371 show examples in which electrons are forced to tunnel into the floating gate from the channel region beneath it.

Another way of programming a memory cell is by the use of channel hot carrier injection. During a programming operation, the electrons flowing from the source to the drain are accelerated by a high electric field across the channel region, and some of them become heated near the drain junction. Some of the hot electrons exceed the oxide barrier height and are injected into floating gate. This technique is found in U.S. Pat. No. 4,698,787.

FIG. 1 illustrates a prior art NOR-type flash EEPROM cell array in which the floating gates 16 have end caps 16a, 16b which extend over the adjacent isolation oxide regions 19. The floating gate is typically made of polysilicon or amorphous silicon with a thickness on the order of 1500–2500 Å. Control gates 21 cross over the floating gates, and are typically made of heavily doped polysilicon or polycide. Select gates 22 are separated from and parallel to the control gates. Bit lines 23, which are typically formed by a metallization layer, interconnect all of the drains of the memory cells in the respective columns, with adjacent ones of the bit lines being isolated from each other. All of the sources of the memory cells in a given row are connected together by a common source line 24 which is typically formed by an N+ or a P+ diffusion layer in the single crystalline silicon substrate.

The floating gate end caps 16a, 16b are required because of a corner-rounding effect or a shift of the floating gate which occurs during the photolithographic step by which the floating gate is formed. The corner-rounding effect may make the edges 16c, 16d of the floating gate shorter, and the shift of the floating gate may make one or both of the edges 16c, 16d move beyond the edges 28a, 28b of active area 28. Both of these effects can cause malfunction of the memory cell because a leakage path may occur when the floating gate does not completely cover the active area or its channel length becomes too short.

FIGS. 2A and 2B illustrate the memory cell array of FIG. 1 with shallow trench and LOCOS (local oxidation of silicon) isolation, respectively. As seen in these figures, an inter-poly dielectric film 31 is formed between the conduction layers which form the floating gates 16 and the control gates 21. Those layers are commonly referred to as the poly-1 and poly-2 layers, respectively, and the dielectric film is typically formed of either pure oxide or a combination of oxide and nitride films.

The end caps 16a, 16b which extend over the adjacent isolation oxide regions 19 help in the formation of large capacitance areas between the control gates 21 and the floating gates 16. Consequently, the coupling ratio from the control gate to the floating gate becomes large, and this makes it possible to couple more voltage from the control gate to the floating gate during programming and erase operations. In order to insure that the floating gate will completely cover the active area and that the channel length will not become too short due to variations during the fabrication process, it is necessary to add tolerance to the memory cell layout by making the floating gate caps wider. In addition, the distance 32 between the end caps has to be kept wide enough to avoid shorts from developing between the floating gates. As a result, the size of the memory cell increases, and the cost gets higher.

OBJECTS AND SUMMARY OF THE INVENTION

It is in general an object of the invention to provide a new and improved memory cell and process for fabricating the same.

Another object of the invention is to provide a memory cell and process of the above character which overcome the limitations and disadvantages of the prior art.

These and other objects are achieved in accordance with the invention by providing a memory cell having a floating gate with lateral edges which are aligned directly above edges of the active area in the substrate, a control gate positioned directly above the floating gate, and a select gate spaced laterally from the control gate. The floating gate has a bottom wall and side walls which face corresponding walls of the control gate in capacitive coupling relationship, with the height of the side walls being on the order of 80 to 160 percent of the width of the bottom wall. In some embodiments, the floating gate is wider than the overlying control gate and has projecting portions which overlie the source and drain regions of the stack transistor.

The memory cell is fabricated by forming a poly-1 layer and an overlying dielectric film on a substrate in areas in which the stack transistors are to be formed, forming a poly-2 layer over the dielectric film and over areas of the substrate in which the select transistors are to be formed, patterning the poly-2 layer to form control gates for the stack transistors and select gates for the select transistors, removing the poly-1 layer and the dielectric film to form floating gates in areas which are not covered by the control gates, and forming source and drain regions in the substrate. The floating gates are aligned with active areas in the substrate by forming isolation oxide regions which extend above the substrate at the edges of the active areas, and forming the floating gates on the sides of the isolation oxide regions in alignment with the edges of the active areas.

BRIEF DESCRIPTION OF THE DRAWINGS

FIG. 3 is a top plan view of one embodiment of a NOR-type flash EEPROM memory cell array fabricated in accordance with the invention.

FIGS. 4A–4F are enlarged, schematic cross-sectional views taken along line 4—4 of FIG. 3, illustrating the steps in one embodiment of a process for fabricating the memory cell array of FIG. 3.

FIGS. 7A, and 7B are enlarged, schematic cross-sectional views taken along line 7—7 of FIG. 6, illustrating the steps in one embodiment of a process for fabricating the memory cell array of FIG. 6.

DETAILED DESCRIPTION

Figure 1:
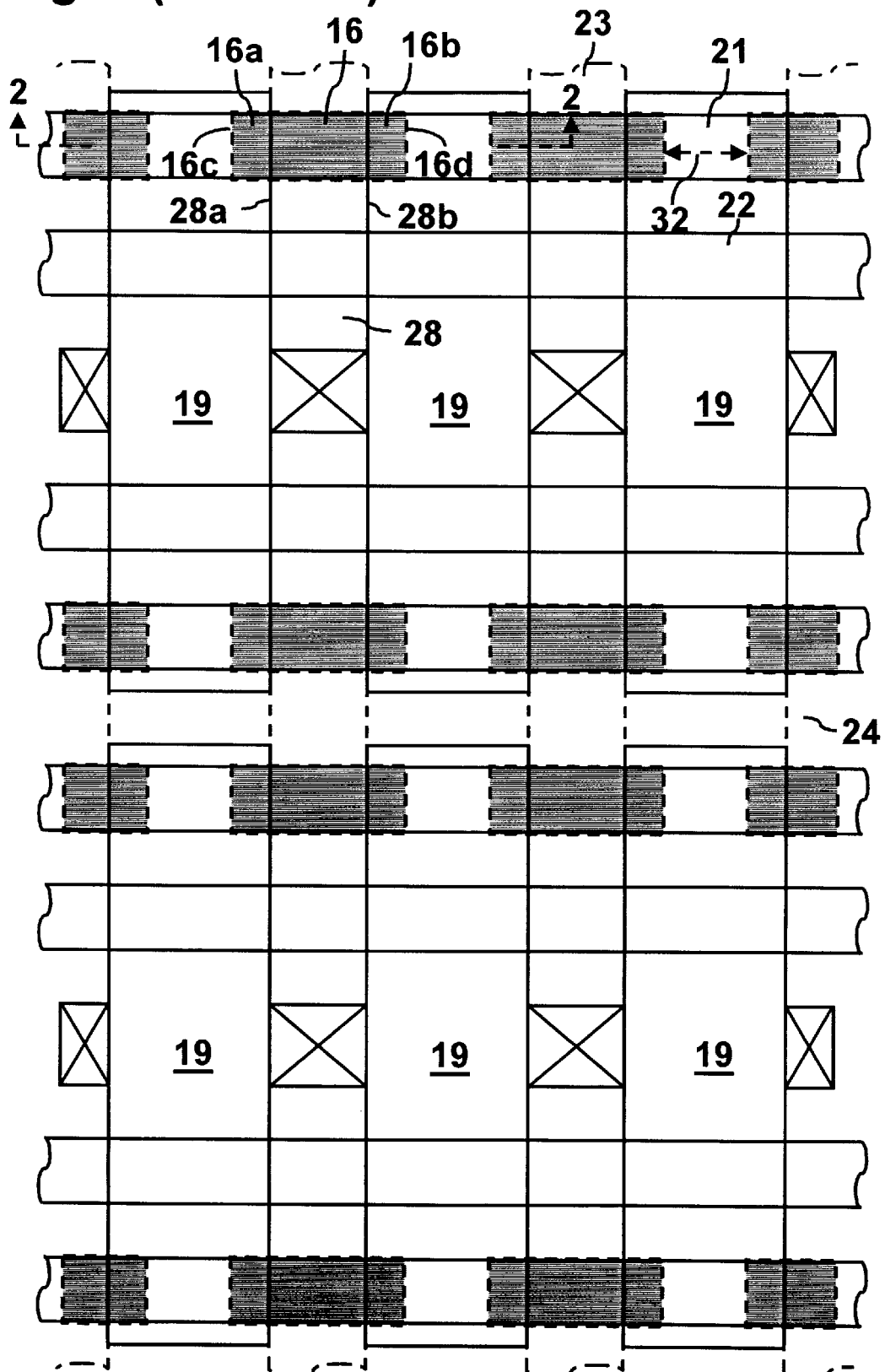
FIG. 1 is a top plan view of a prior art NOR-type flash EEPROM memory cell array.
Figure 2A:
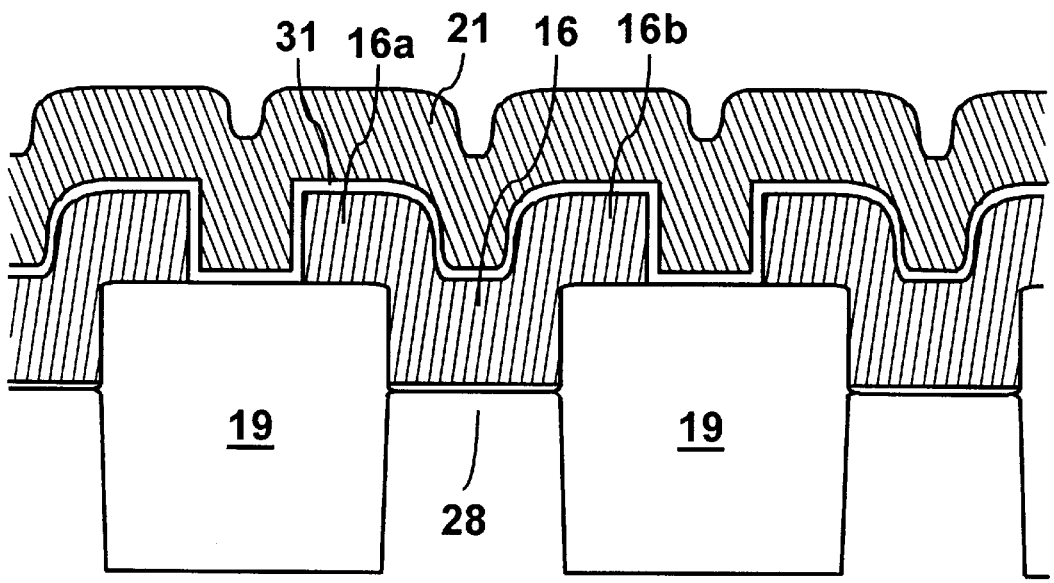
FIGS. 2A and 2B are enlarged, fragmentary cross-sectional views taken along line 2—2 of FIG. 1.
Figure 2B:
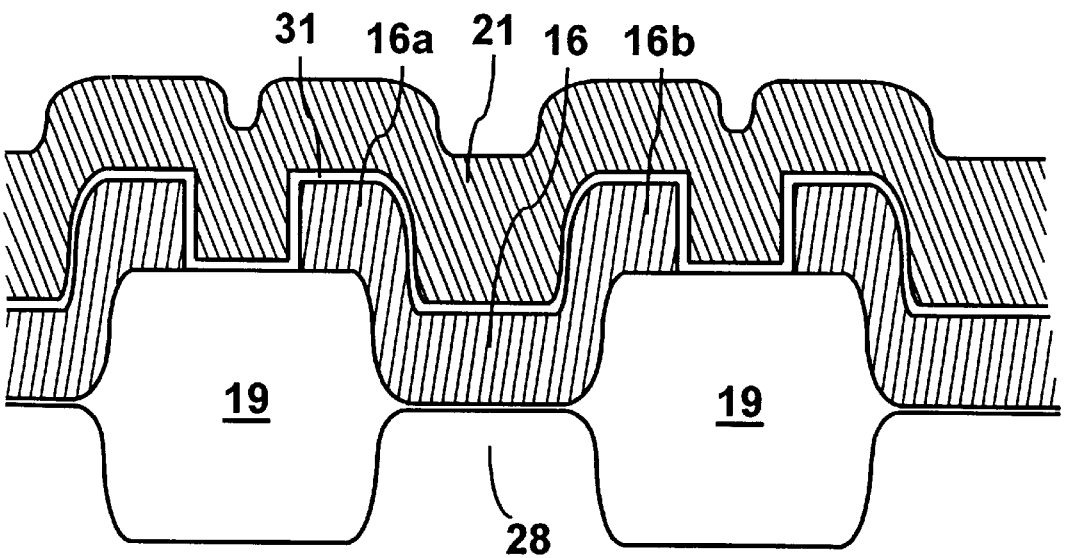

As illustrated in FIG. 3, a NOR-type flash EEPROM memory cell array fabricated in accordance with the invention has floating gates 41 with two edges 41a, 41b which are self-aligned with the edges 42a, 42b of the active areas 42. The end caps of the prior art devices are eliminated, and as discussed more fully hereinafter, the control gates 43 and the select gates 44 are defined simultaneously in a single photolithographic masking step. The other two edges 41c, 41d of the floating gates are defined after the side edges 43a, 43b of the control gates are formed, and the floating gates are wider than the control gates. With the self-aligned floating gates, cell size and die cost are both greatly reduced.

Figure 4A:
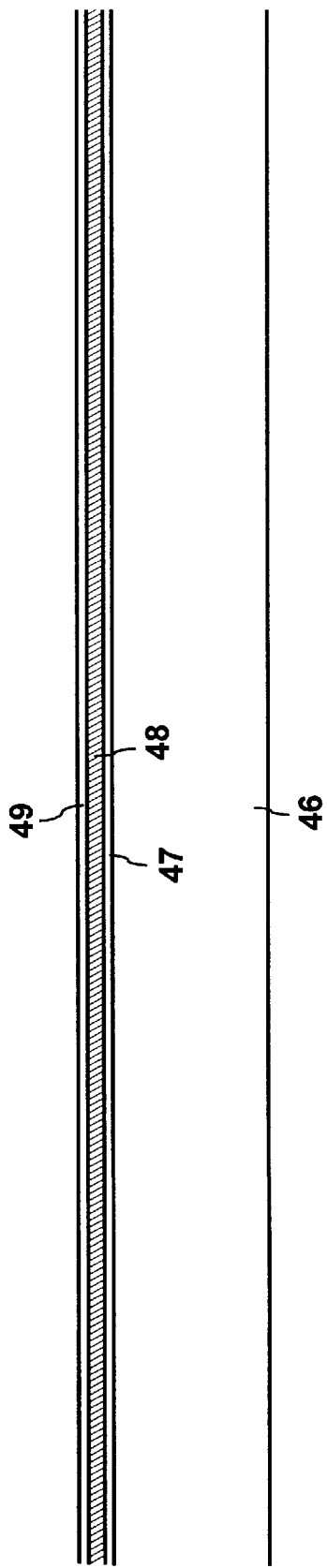

As illustrated in FIG. 4A, the memory cell is fabricated on a silicon substrate 46 which can be an N-well, P-well or P-substrate material. An oxide layer 47 having a thickness on the order of 70–120 Å is thermally grown on the substrate to form the gate oxides of the floating gate transistors. A conduction layer 48 of polysilicon or amorphous silicon (poly-1) having a thickness on the order of 100–1000 Å is deposited on the thermal oxide. The poly-1 layer is doped with phosphorus, arsenic or boron to a level on the order of $10^{17}$ to $10^{20}$ per $cm^3$ either in-situ during deposition of the silicon or by ion implantation. A dielectric film 49 is then formed on the poly-1 layer. This film can be either a pure oxide or a combination of oxide and nitride, and in one presently preferred embodiment, it consists of a lower oxide layer having a thickness on the order of 30–100 Å, a central nitride layer having a thickness on the order of 60–300 Å, and an upper oxide layer having a thickness on the order of 30–100 Å.

Figure 4B:
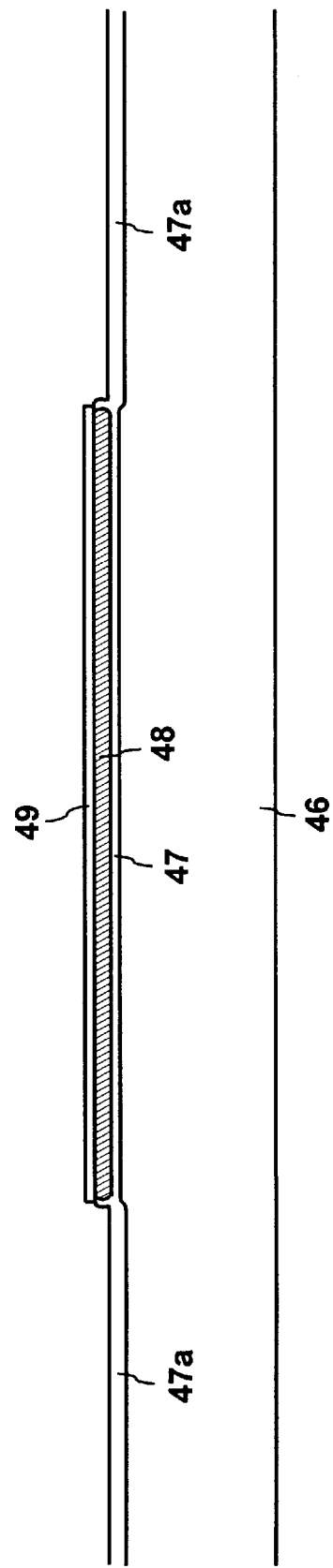

A photolithographic mask (not shown) is then formed over the areas in which stack transistors are to be formed, and the poly-1 layer and the dielectric film are then etched away in the areas in which select transistors are to be formed, as illustrated in FIG. 4B. Another thermal oxidation is then performed to form the gate oxide 47a for the select transistors. That oxide preferably has a thickness on the order of 150–350 Å.

Referring now to FIG. 4C, a second polysilicon layer 51 (poly-2) is deposited across the wafer to form the conduction layer 51a, 51b for the control gates and the select gates. The poly-2 layer has a thickness on the order of 1500–3000 Å, and is doped with phosphorus, arsenic or boron to a level on the order of $10^{20}$ to $10^{21}$ per $cm^3$. If desired, a polycide film can be formed on the poly-2 layer to reduce its sheet resistance. A dielectric film 52 of oxide or nitride is then deposited on the poly-2 layer.

A photolithographic mask (not shown) is positioned over dielectric film 52 to define the control gates and the select gates, and an anisotropic etch is performed to remove film 52 and the poly-2 layer in the unmasked areas, leaving the structure shown in FIG. 4D in which control gates 43 and select gates 44 are formed. The poly-1 layer which forms the floating gates is protected by dielectric layer 49 and is not etched at this time.

An oxide film is then deposited across the wafer, and then removed from the flat areas in an anisotropic dry etch to form oxide spacers 53 which surround the control gates and select gates, as shown in FIG. 4E.

Referring now to FIG. 4F, using the control gates and the oxide spacers as a mask, the floating gates 41 are formed by etching away the dielectric film 49 and the poly-1 material which are not covered by the mask. The oxide spacers are then widened by depositing an oxide film and etching it away anisotropically. Source and drain regions 56–58 are then formed by ion implantation, with the junction depth of the source regions 58 of the stack transistors being made greater to withstand the relatively high voltages applied to the source nodes during erase operations.

With the floating gates being wider than the overlying control gates, an erase path or window is formed between one protruding portion of each of the floating gates and the underlying source region 58a. The other protruding portion is positioned above the drain region 57a of the stack transistor.

Figure 5A:
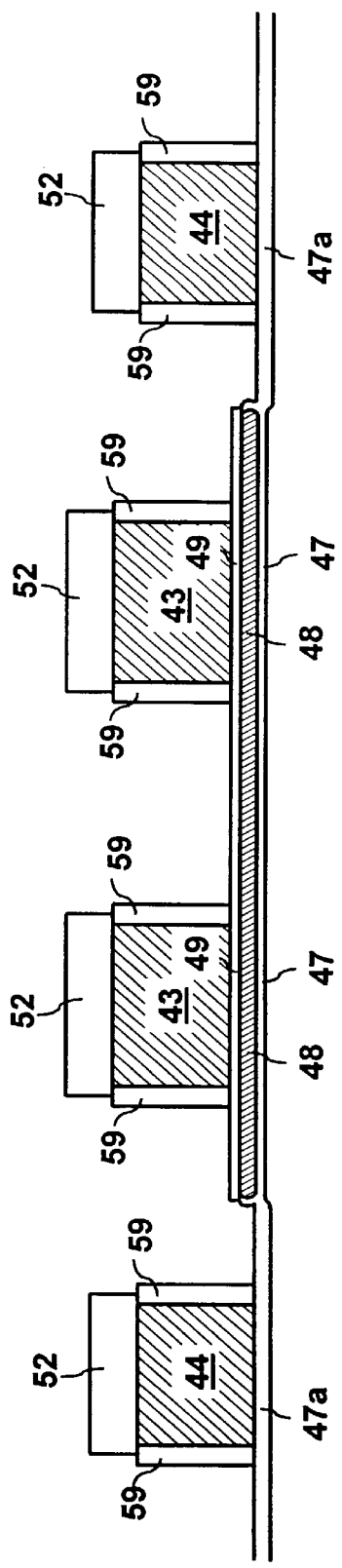
FIGS. 5A–5C are schematic cross-sectional views similar to FIGS. 4A –4F, illustrating the steps in another embodiment of a process for fabricating the memory cell array of FIG. 3.
Figure 5B:
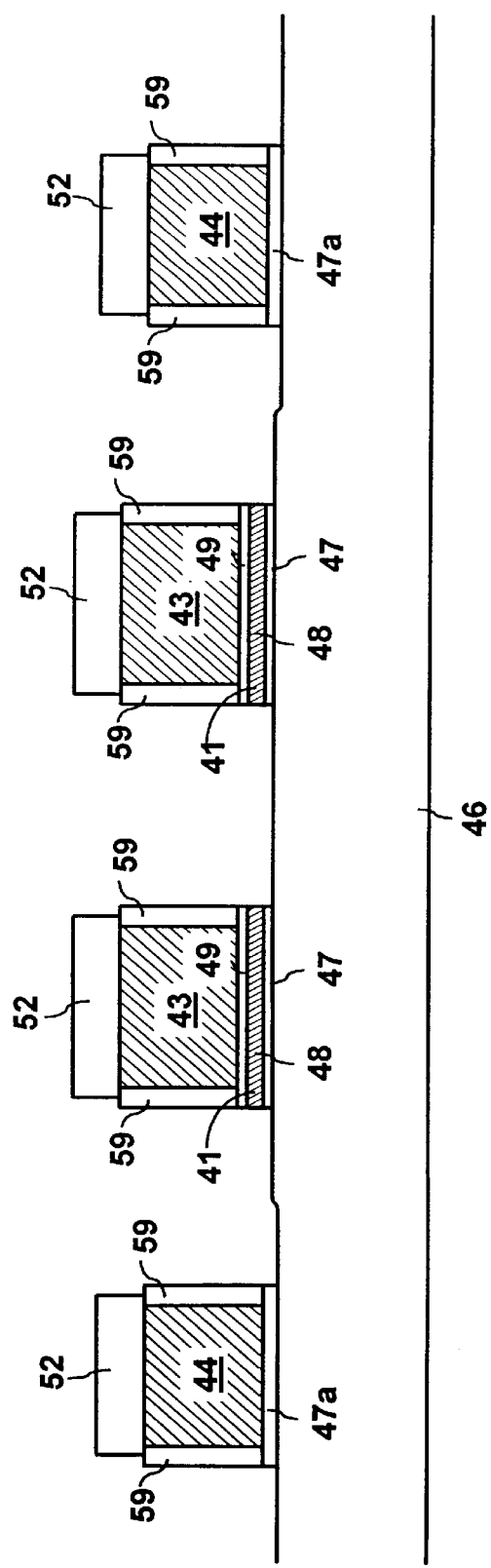
Figure 5C:
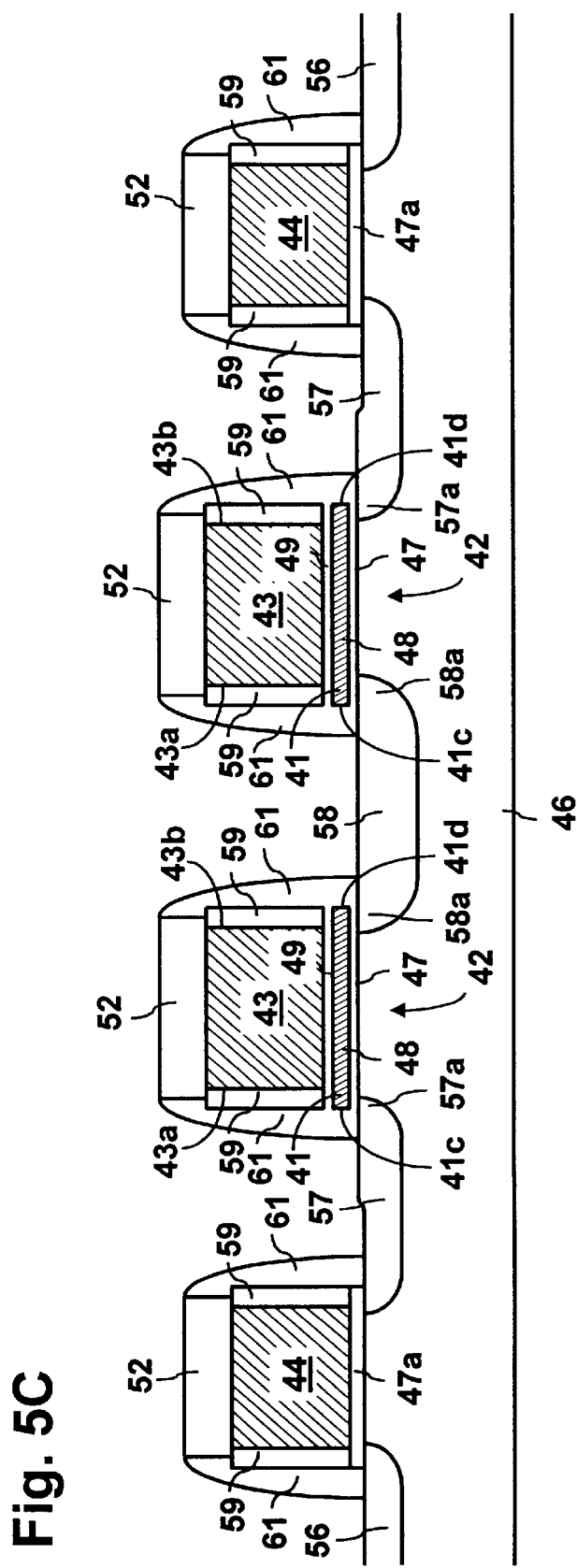

FIGS. 5A–5C illustrate an alternate embodiment for processing the cell array after it has reached the point shown in FIG. 4D. In this embodiment, a poly-oxide layer 59 is formed by thermal oxidation on the side walls of the control gates and the select gates to a thickness which is preferably on the order of about 100–400 Å. Using the control gates and the poly-oxide layers as a mask, the floating gates 41 are formed by etching away the dielectric film 49 and the poly-1 material outside the masked area, as shown in FIG. 5B. Thereafter, oxide spacers 61 are formed around the select gates and the control gates. In this embodiment, the spacers surround the floating gates as well as the control gates. Source and drain regions 56–58 are formed by ion-implantation, and the source junctions 58 is made deeper to withstand the high voltages that are applied to the source nodes during erase operations.

Figure 6:
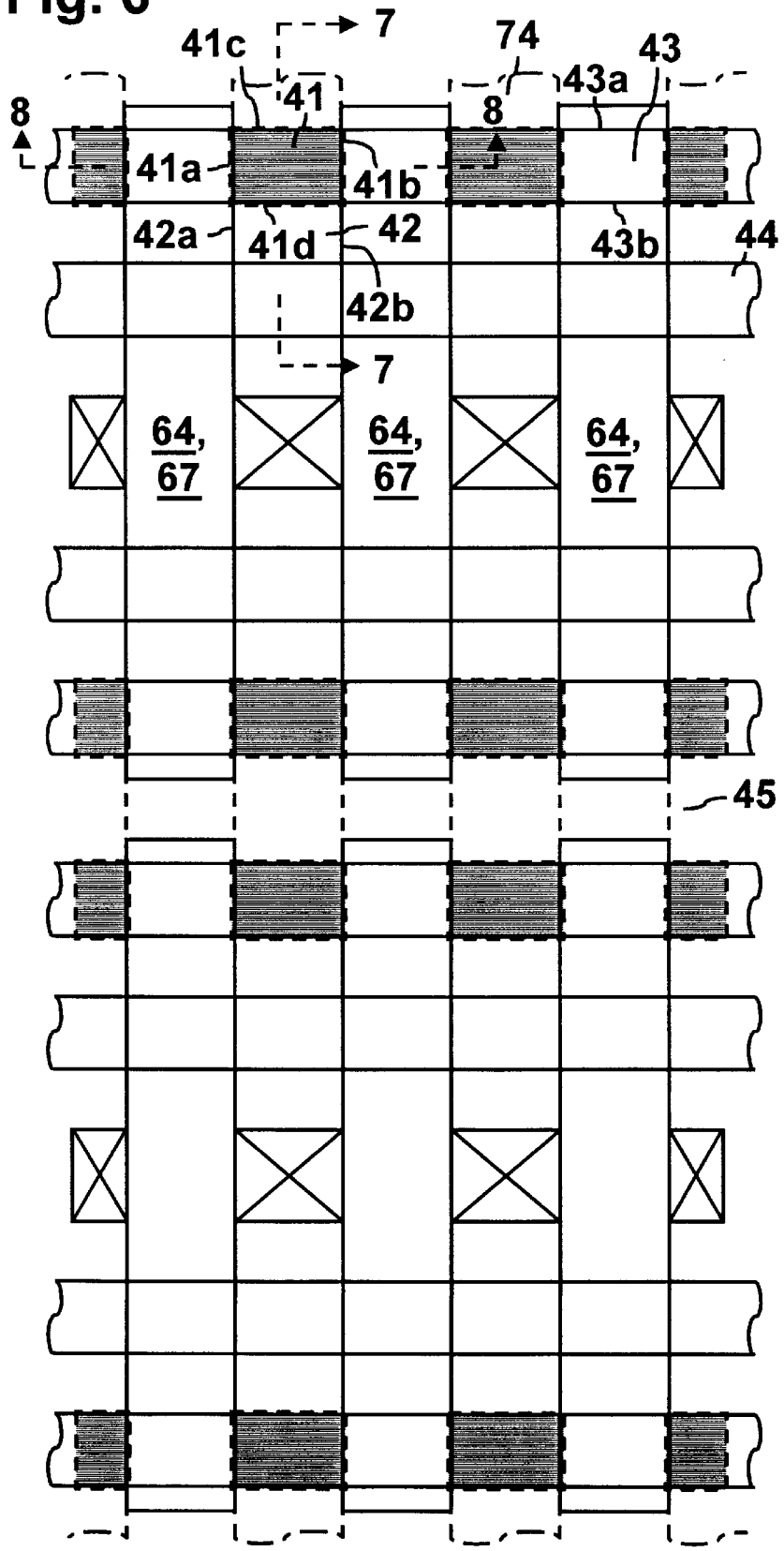
FIG. 6 is a top plan view of another embodiment of a NOR-type flash EEPROM memory cell array fabricated in accordance with the invention.

The embodiment of the NOR-type flash EEPROM memory cell array illustrated in FIG. 6 is similar to the embodiment of FIG. 3 in that the edges 41a, 41b of the floating gates are self-aligned with the edges 42a, 42b of the active areas 42, and the control gates 43 and select gates 44 are defined simultaneously in a single photolithographic masking step. However, it differs in that the other two edges 41c, 41d of the floating gates are aligned with the side edges 43a, 43b of the control gates, rather than having the floating gates be wider than the control gates.

This embodiment is fabricated in accordance with the steps illustrated in FIGS. 4A–4D, following which control gates 43 are used as a mask in the etching of dielectric film 49 and the poly-1 layer 48 to form floating gates 41, as illustrated in FIG. 7A. With the control gates as a mask, the edges 41c, 41d of the floating gates are aligned with the edges 43a, 43b of the control gates. Thereafter, as illustrated in FIG. 7B, oxide spacers 62 are formed around the select gates and the control gates by depositing an oxide film and then etching it away anisotropically in the flat areas. As in the previous embodiment, the spacers surround the floating gates as well as the control gates. Source and drain regions 56–58 are formed by ion-implantation, and the source junctions 58 is made deeper to withstand the high voltages that are applied to the source nodes during erase operations.

Figure 8A:
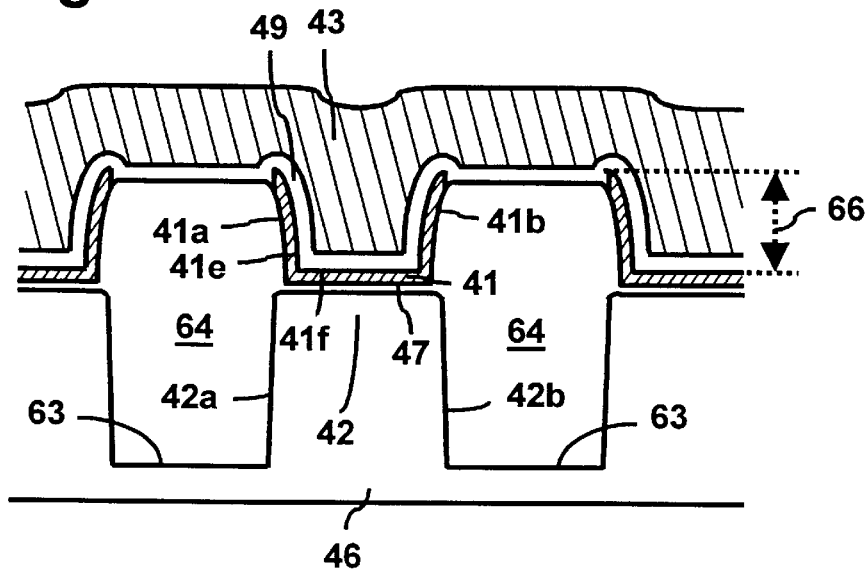
FIGS. 8A and 8B are enlarged cross-sectional views taken along lines 8—8 of FIGS. 3 and 6.
Figure 8B:
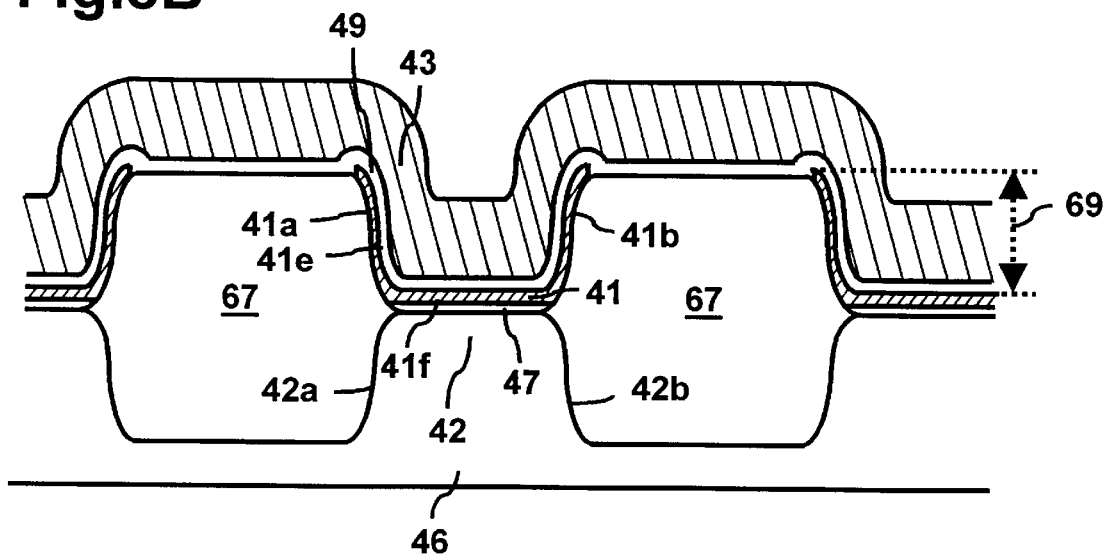

FIGS. 8A and 8B show cross-sections of the embodiments of the memory cell arrays of FIGS. 3 and 6 utilizing shallow trench and LOCOS isolation for aligning the edges 41a, 41b of the floating gates with the edges 42a, 42b of the active areas. Those techniques are described in detail in Ser. No. 09/255,360, the disclosure of which is incorporated herein by reference.

In the embodiment illustrated in FIG. 8A, shallow trenches 63 are formed in the silicon substrate 46, and an isolation oxide 64 is deposited in the trenches and planarized. When the poly-1 layer 48 is deposited, it covers the isolation oxide as well as the thermal oxide 47, and when it is etched to form the floating gates, it remains on the side walls of the isolation oxide as well as on the thermal oxide. Thus, the floating gates have side walls 41e and bottom walls 41f, with the height of the side walls being on the order of 80 to 160 percent of the width of the bottom walls. The control gates 43 extend into the regions bounded by the side walls, and the areas of the side walls add significantly to the capacitance between the gates.

Since the trenches in which the isolation oxide is formed define the edges 42a, 42b of the active areas, the edges 41a, 41b of the floating gates are automatically aligned with those edges when the floating gates are formed on the sides of the isolation oxide. Again in this embodiment, the floating gates have side walls 41e and bottom walls 41f, with the height of the side walls being on the order of 80 to 160 percent of the width of the bottom walls. By making the poly-1 layer thin and having it extend along the side walls as well as the bottom walls of the control gates, the capacitance between the control gates and the floating gates is made high. By increasing the height 66 of the isolation oxide above the surface of the poly-1 material, the capacitance can be further increased. This results in a large coupling ratio between the control gates and the floating gates.

The embodiment of FIG. 8B is similar to the embodiment of FIG. 8A except that it uses LOCOS isolation instead of shallow trenching. In this embodiment, the isolation oxide 67 is thermally grown to define the edges 42a, 42b of the active areas, and the poly-1 layer which forms the floating gates is deposited over that oxide. Since the floating gates extend along the side walls of the isolation oxide, the edges 41a, 41b of the floating gates are automatically aligned with the edges of the active areas. With the thin poly-1 layer extending along both the side walls and the bottom walls of the control gates, the capacitance between the control gates and the floating gates is once again high, and can be made even higher by increasing the height 69 of the isolation oxide. This again results in a large coupling ratio between the control gates and the floating gates.

Figure 9:
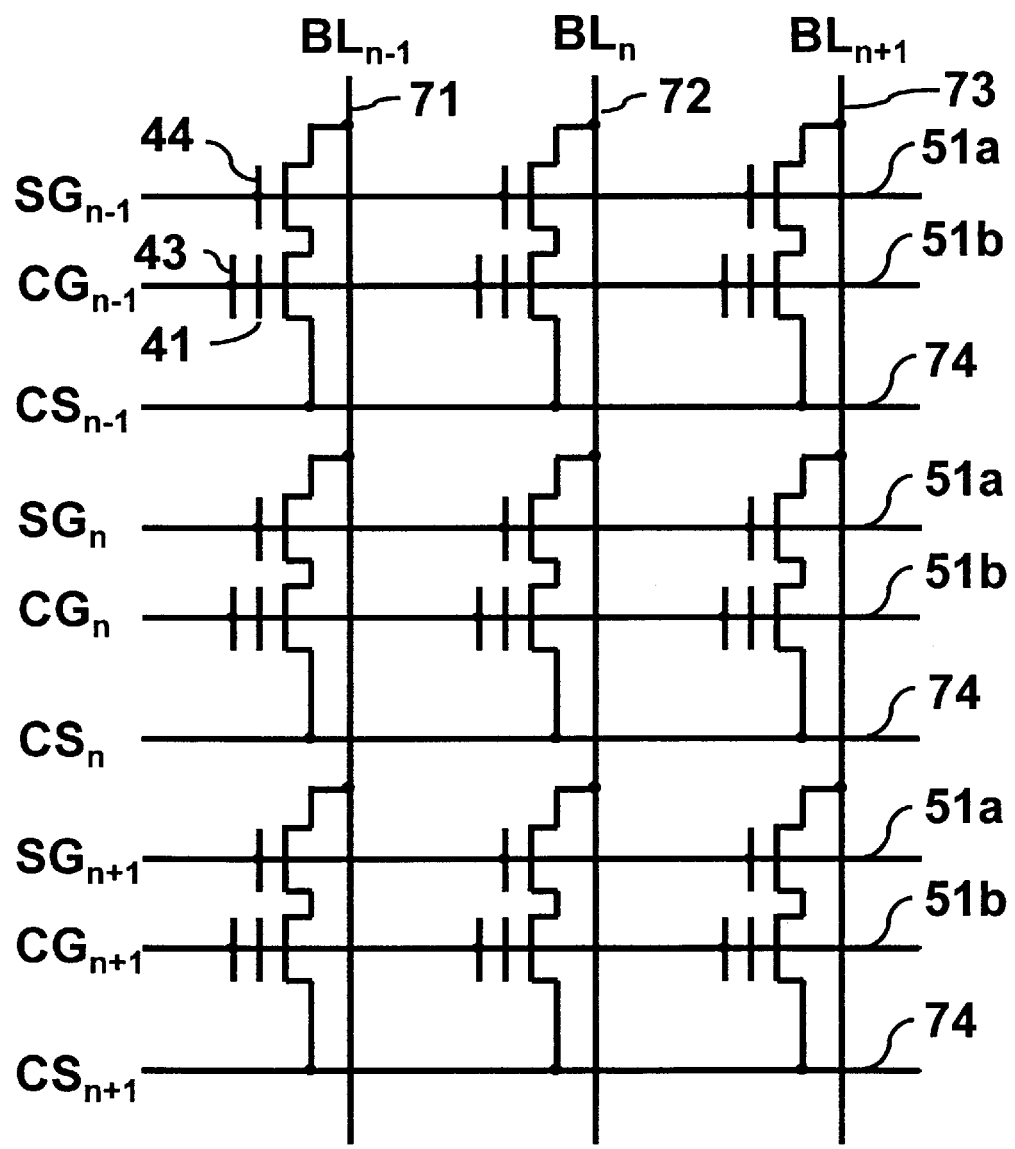
FIG. 9 is a circuit diagram of the memory cell arrays of FIGS. 3 and 6.

A circuit diagram for the memory cell arrays of FIGS. 3 and 6 is shown in FIG. 9. All of the memory cells in a given column have their drains connected to bit lines $BL_{n-1}$, $BL_n$, $BL_{n+1}$, etc., which are typically metal lines 71–73 that cross over the active areas, and are isolated from each other by a dielectric film (not shown). All of the cells in a given row are connected to a source line 74, which is typically an N+ or P+ diffusion layer in the silicon substrate 46. In a given row, all of the control gates 43 are connected together by the portion of the poly-2 layer 51a of which they are formed, and all of the select gates 44 are connected to a word line comprising the portion of the poly-2 layer 51b of which they are formed. The control gates and the select gates cross over the active areas and the isolation oxides.

Operation of the memory cells fabricated in accordance with the processes of FIGS. 4A–4F, 5A–5C and 7A–7B is as follows, with bias voltages applied to the four node terminals as set forth in Table 1.

TABLE 1

| Mode | Control Gate | Select Gate | Drain | Source |
| --- | --- | --- | --- | --- |
| Erase (1) | 0 volts | Floating | Floating | 12 to 15 volts |
| Erase (2) | −5 to −10 volts | Floating | Floating | 5 to 10 volts |
| Erase (3) | −5 to −10 volts | 7 to 12 volts | 5 to 10 volts | Floating |
| Program (1) | 8 to 12 volts | 6 to 8 volts | 5 volts | 0 volts |
| Program (2) | 12 to 15 volts | 0 volts | Floating | 0 volts |
| Program (3) | 12 to 15 volts | 2 to 5 volts | 0 volts | Floating |
| Read | 3 to 5 volts | 1.5 to 3 volts | 1.5 to 3 volts | 0 volts |

In the erase mode, electrons are forced to travel from the floating gates 41 to the overlapped source regions 58a or the overlapped drain regions 57a by Fowler-Nordheim tunneling. During erase operations, a relatively high electric field (greater than 10 mV/cm) is established across tunnel oxide 47. Erase paths between the floating gates 41 and the overlapped source nodes 58a are established either by applying 0 volts to the control gates and about 12 to 15 volts to the source nodes, or by applying a negative voltage of about −5 to −10 volts to the control gates and a positive voltage of about 5 to 10 volts to the source nodes. Those are the two modes which are designated Erase (1) and Erase (2) in Table 1. In both cases, the select gate and the drain node are kept floating.

Alternatively, erase paths can be established between the floating gates 41 and the overlapped drain nodes 57a by applying a negative voltage of about −5 to −10 volts to the control gates, a positive voltage of about 5 to 10 volts to the drain nodes, a positive voltage of about 7 to 12 volts to the select gates, and keeping the source nodes floating. This is the Erase (3) mode shown in Table 1.

In all of these embodiments, the coupling ratio from the control gate to the floating gate in the erase mode is typically on the order of 85 percent. Accordingly, most of the voltage difference between the source or drain and control gates is applied across the tunnel oxide, initiating Fowler-Nordheim tunneling and forcing electrons to migrate from the floating gates to the overlapped source or drain regions. After an erase operation, the floating gates are positively charged, the threshold voltage of the cell becomes lower, and the cell is in a conducting, or logic "1", state.

In the program mode, electrons are injected into the floating gates, and the floating gates become negatively charged. This can be done either by hot carrier injection or by Fowler-Nordheim tunneling. In hot carrier injection, shown as the Program (1) mode in Table 1, the control gates are biased about 8 to 12 volts, the select gates are biased at about 6 to 8 volts, the drains are biased at about 5 volts, and the sources are biased at 0 volts. When electrons flow from the sources 58 to the drains 57, they are accelerated by the high electric field in the channel regions 42, and some of them become heated near the drain junctions. Some of the hot electrons exceed the oxide barrier height of about 3.1 eV and are injected into the floating gates.

Fowler-Nordheim tunneling can be utilized for programming by biasing the nodes in either of the two ways indicated as the Program (2) and Program (3) modes in Table 1. In the Program (2) mode, programming paths are established between the floating gates 41 and the overlapped source nodes 58a by applying about 12 to 15 volts to the control gates and 0 volts to the source nodes and the select gates at 0 volts, with the drain nodes floating. In the Program (3) mode, programming paths are established between the floating gates and the overlapped drain nodes 57a by applying about 12 to 15 volts to the control gates, 0 volts to the drain nodes, and about 2 to 5 volts to the select gates, with the source nodes floating. Following a programming operation, the floating gates are negatively charged, the threshold voltage of the cell becomes higher, and the cell is in a non-conducting, or logic "0", state.

In the read mode, the control gates are biased to about 3 to 5 volts, the select gates are biased to about 1.5 to 3 volts, the sources are biased to 0 volts, and the drains are biased to about 1.5 to 3 volts. When a memory cell is in an erase state, the read shows a conducting state, and the sense amplifier reads a logic "1". When the cell is in the programming state, the read shows a non-conducting state, and the sense amplifier reads a logic "0".

When memory cells are constructed in P-wells, a programming operation using Fowler-Nordheim tunneling can be performed by applying 0 volts to the P-well nodes and about 12 to 18 volts to the control gates, with the source and drain nodes floating. In this mode, electrons migrate from the channel regions 42 to the floating gates 41, and the floating gates become negatively charged.

It is apparent from the foregoing that a new and improved memory cell and fabrication process have been provided. While only certain presently preferred embodiments have been described in detail, as will be apparent to those familiar with the art, certain changes and modifications can be made without departing from the scope of the invention as defined by the following claims.

What is claimed is:

1. In a memory cell: a substrate having an active area with source and drain regions on opposite sides of the active area, a floating gate which overlies the active area with portions of the floating gate extending laterally beyond the active area and overlying portions of the source and drain regions, a control gate positioned directly above the floating gate, and a select gate positioned entirely to one side of the floating gate and the control gate.

2. The memory cell of claim 1 wherein the floating gate has a bottom wall and side walls which face corresponding walls of the control gate in capacitive coupling relationship, with the height of the side walls being on the order of 80 to 160 percent of the width of the bottom wall.

3. The memory cell of claim 2 wherein the bottom wall and the side walls of the floating gate have a thickness no greater than about 1000 Å.

4. The memory cell of claim 1 wherein the floating gate is wider than the control gate.

5. The memory cell of claim 1 wherein an erase window is formed between the source region and the portion of the floating gate which overlies it.

6. The memory cell of claim 1 wherein the source region has a greater junction depth than the drain region.

7. The memory cell of claim 1 wherein the control gate, the select gate and the source and drain regions are biased to establish a Fowler-Nordheim tunneling path from the floating gate to the source region during an erase operation.

8. The memory cell of claim 1 wherein the control gate, the select gate and the source and drain regions are biased to establish a Fowler-Nordheim tunneling path from the floating gate to the drain region during an erase operation.

9. The memory cell of claim 1 wherein the control gate, the select gate and the source and drain regions are biased to establish a Fowler-Nordheim tunneling path from the source region to the floating gate during a programming operation.

10. The memory cell of claim 1 wherein the control gate, the select gate and the source and drain regions are biased to establish a Fowler-Nordheim tunneling path from the drain region to the floating gate during a programming operation.

11. The memory cell of claim 1 wherein the control gate, the select gate and the source and drain regions are biased to establish hot carrier injection from the active region to the floating gate during a programming operation.

12. In a process of fabricating a memory cell, the steps of: forming an active area in a substrate, forming a floating gate which overlies the active area with portions of the floating gate extending laterally beyond the active area, forming a control gate directly above the floating gate, forming a select gate entirely to one side of the floating gate and the control gate, and forming source and drain regions on opposite sides of the active area with the laterally extending portions of the floating gate overlying portions of the source and drain regions.

13. The process of claim 12 wherein the floating gate is formed with a bottom wall and side walls which face corresponding walls of the control gate in capacitive coupling relationship, with the height of the side walls being on the order of 80 to 160 percent of the width of the bottom wall.

14. The process of claim 13 wherein the bottom wall and the side walls of the floating gate are formed with a thickness no greater than about 1000 Å.

15. The process of claim 12 wherein the floating gate is formed wider than the control gate.

16. The process of claim 12 wherein an erase window is formed between the source region and the portion of the floating gate which overlies it.

17. The process of claim 12 wherein the source region is formed with a greater junction depth than the drain region.

18. The process of claim 12, including the steps of biasing the control gate, the select gate and the source and drain regions to establish a Fowler-Nordheim tunneling path from the floating gate to the source region during an erase operation.

19. The process of claim 12, including the steps of biasing the control gate, the select gate and the source and drain regions to establish a Fowler-Nordheim tunneling path from the floating gate to the drain region during an erase operation.

20. The process of claim 12, including the steps of biasing the control gate, the select gate and the source and drain regions to establish a Fowler-Nordheim tunneling path from the source region to the floating gate during a programming operation.

21. The process of claim 12, including the steps of biasing the control gate, the select gate and the source and drain regions to establish a Fowler-Nordheim tunneling path from the drain region to the floating gate during a programming operation.

22. The process of claim 12, including the steps of biasing the control gate, the select gate and the source and drain regions to establish hot carrier injection from the active region to the floating gate during a programming operation.

23. In a memory cell: a substrate having an active area with source and drain regions of different junction depth on opposite sides of the active area, a floating gate which overlies the active area with portions of the floating gate extending laterally beyond the active area and overlying portions of the source and drain regions, a control gate positioned directly above the floating gate, a select gate positioned to one side of the floating gate and the control gate, and additional source and drain regions formed in the substrate toward opposite sides of the select gate.

24. The memory cell of claim 23 wherein the source region has a greater junction depth than the drain region.

25. In a process of fabricating a memory cell, the steps of: forming an active area in a substrate, forming a floating gate which overlies the active area with portions of the floating gate extending laterally beyond the active area, forming a control gate directly above the floating gate, forming a select gate entirely to one side of the floating gate and the control gate, forming source and drain regions of different junction depth on opposite sides of the active area with the laterally extending portions of the floating gate overlying portions of the source and drain regions, and forming additional source and drain regions in the substrate toward opposite sides of the select gate.

26. The process of claim 25 wherein the source region is formed to a greater junction depth than the drain region.

27. In a memory cell:

a substrate;

a stack transistor formed on the substrate, comprising an active area in the substrate with source and drain regions on opposite sides of the active area, a floating gate which overlies the active area with portions of the floating gate extending laterally beyond the active area and overlying portions of the source and drain regions, and a control gate positioned directly above the floating gate; and a select transistor formed on the substrate to one side of the stack transistor, comprising a select gate positioned entirely to the side of the stack transistor, and additional source and drain regions formed in the substrate toward opposite sides of the select gate.

28. The memory cell of claim 27 wherein the source region in the stack transistor has a greater junction depth than the drain region.

* * * * *